United States Patent
Chen et al.

(10) Patent No.: US 10,492,610 B2
(45) Date of Patent: Dec. 3, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 118 days.

(21) Appl. No.: 15/693,500

(22) Filed: Sep. 1, 2017

(65) Prior Publication Data
US 2018/0199714 A1   Jul. 19, 2018

(30) Foreign Application Priority Data
Jan. 19, 2017   (TW) .............................. 106102294 A

(51) Int. Cl.
| A47B 88/75 | (2017.01) |
| A47B 88/423 | (2017.01) |
| A47B 88/483 | (2017.01) |
| A47B 96/06 | (2006.01) |
| A47B 96/07 | (2006.01) |
| H05K 7/18 | (2006.01) |
| H05K 7/14 | (2006.01) |

(52) U.S. Cl.
CPC ............ *A47B 88/75* (2017.01); *A47B 88/423* (2017.01); *A47B 88/483* (2017.01); *A47B 96/07* (2013.01); *H05K 7/1489* (2013.01)

(58) Field of Classification Search
CPC ..... A47B 88/75; A47B 88/423; A47B 88/483; A47B 88/044; A47B 88/12; H05K 7/1489; H05K 7/183
See application file for complete search history.

(56) References Cited

U.S. PATENT DOCUMENTS

| 6,318,679 | B1 * | 11/2001 | Yang ....................... G06F 1/184 |
| | | | 248/201 |
| 6,578,939 | B1 * | 6/2003 | Mayer ................... A47B 88/43 |
| | | | 312/334.5 |
| 6,938,967 | B2 * | 9/2005 | Dubon ................. H05K 7/1421 |
| | | | 312/330.1 |
| 7,055,701 | B2 | 6/2006 | Dean |
| 7,218,526 | B2 | 5/2007 | Mayer |
| 8,605,442 | B2 * | 12/2013 | Wu ....................... H05K 7/1489 |
| | | | 211/26 |
| 8,607,993 | B2 | 12/2013 | Williams |
| 9,229,942 | B1 * | 1/2016 | MacNeill ............ G06F 11/1458 |

(Continued)

FOREIGN PATENT DOCUMENTS

| EP | 2 893 838 A1 | 7/2015 |
| JP | 2004-177443 A | 6/2004 |
| JP | 3191407 U | 6/2014 |

*Primary Examiner* — Tan Le
(74) *Attorney, Agent, or Firm* — Winston Hsu

(57) ABSTRACT

A slide rail assembly includes a first rail, a second rail and a third rail. The first rail has a first region and a second region. The second rail is arranged on the first region and movable relative to the first rail.

18 Claims, 8 Drawing Sheets

(56) References Cited

U.S. PATENT DOCUMENTS

| | | |
|---|---|---|
| 9,456,522 B2 | 9/2016 | Aimone |
| 2011/0011817 A1 | 1/2011 | Yamakawa |
| 2012/0092828 A1 | 4/2012 | Wu |
| 2013/0161468 A1* | 6/2013 | Chen .................... H05K 7/1489 |
| | | 248/298.1 |
| 2017/0164507 A1* | 6/2017 | Liao ....................... H05K 7/183 |

* cited by examiner

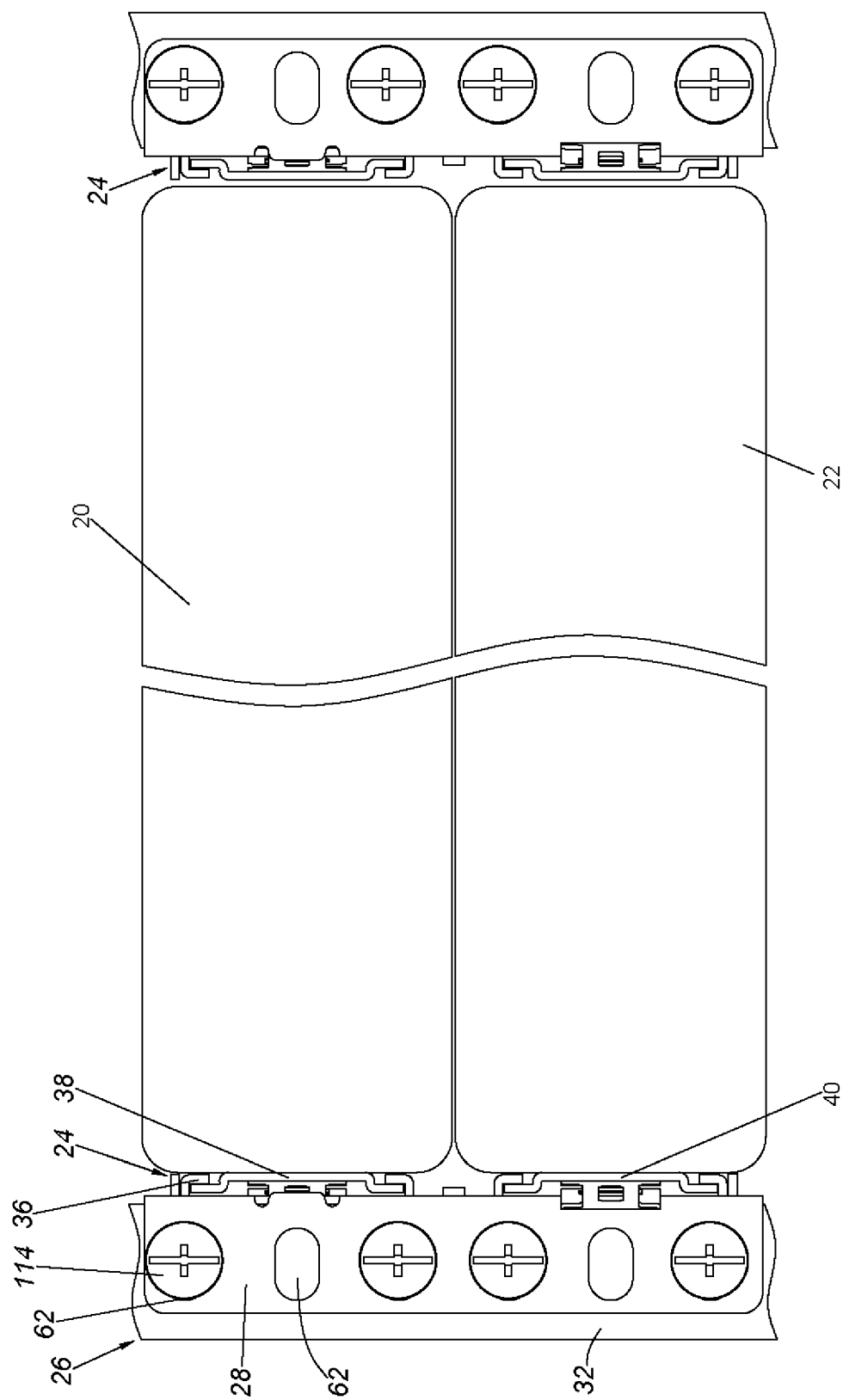

SLIDE RAIL ASSEMBLY

BACKGROUND OF THE INVENTION

1. Field of the Invention

The present invention relates to a slide rail assembly, and more particularly, to a slide rail assembly having a slide rail capable of supporting two other slide rails at different positions on a same side.

2. Description of the Prior Art

As shown in FIG. 1, a first carried object 200 (such as an 1U chassis) and a second carried object 202 (such as an 1U chassis) are mounted to a rack 208 respectively through a pair of first slide rail assemblies 204 and a pair of second slide rail assemblies 206. Wherein, each of the first slide rail assemblies 204 comprises a first rail 210 and a second rail 212 movable relative to the first rail 210. The first rail 210 of the first slide rail assembly 204 is mounted to a first post 218 of the rack 208 through a first bracket 216, and the first carried object 200 is mounted to the second rail 212 of the first slide rail assembly 204. On the other hand, each of the second slide rail assemblies 206 comprises a first rail 220 and a second rail 222 movable relative to the first rail 220. The first rail 220 of the second slide rail assembly 206 is mounted to the first post 218 of the rack 208 through a first bracket 224, and the second carried object 202 is mounted to the second rail 222 of the second slide rail assembly 206.

The first carried object 200 and the second carried object 202 require two pairs of slide rail assemblies for being mounted to the rack, so as to increase mounting cost and mounting time.

SUMMARY OF THE INVENTION

An objective of the present invention is to provide a slide rail assembly having a slide rail capable of supporting two other slide rails at different positions on a same side.

Another objective of the present invention is to provide a slide rail assembly having a slide rail capable of supporting two other slide rails on a same supporting surface, in order to mount two carried objects respectively through the two other slide rails.

According to an embodiment of the present invention, a slide rail assembly comprises a first rail, a second rail and a third rail. The first rail has a first region and a second region located at different positions on a same side of the first rail. The second rail is arranged on the first region and movable relative to the first rail. The third rail is arranged on the second region and movable relative to the first rail.

Preferably, the second rail and the third rail are movable relative to the first rail along a longitudinal direction of the first rail.

Preferably, the first region and the second region are respectively arranged with a first passage and a second passage. The first rail comprises a longitudinal wall, a first upper wall, a first lower wall, a second upper wall and a second lower wall. A first passage is defined by the longitudinal wall, the first upper wall and the first lower wall. The second rail is movable relative to the first rail through the first passage. A second passage is defined by the longitudinal wall, the second upper wall and the second lower wall. The third rail is movable relative to the first rail through the second passage.

Preferably, each of the first upper wall and the first lower wall of the first rail comprises a first wall section and a second wall section substantially perpendicularly connected to the first wall section. The second rail comprises an upper rail section, a lower rail section and a middle section connected between the upper rail section and the lower rail section of the second rail. The upper rail section and the lower rail section of the second rail are located within the first passage of the first rail and configured to respectively abut against the first upper wall and the first lower wall of the first rail.

Preferably, each of the second upper wall and the second lower wall of the first rail comprises a third wall section and a fourth wall section substantially perpendicularly connected to the third wall section. The third rail comprises an upper rail section, a lower rail section and a middle section connected between the upper rail section and the lower rail section of the third rail. The upper rail section and the lower rail section of the third rail are located within the second passage of the first rail and configured to respectively abut against the second upper wall and the second lower wall of the first rail.

Preferably, the first rail further comprises a blocking feature located adjacent to an end of the first passage.

Preferably, the slide rail assembly further comprises an elastic member arranged at the second rail. When the second rail is located at an extension position relative to the first rail, the blocking feature is configured to block the second rail through the elastic member.

Preferably, at least one of the second rail and the third rail has a plurality of mounting holes. Each of the mounting holes has a first hole part and a second hole part communicated with the first hole part. The first hole part is greater than the second hole part.

Preferably, the slide rail assembly further comprises a blocking member configured to block the first hole part of one of the mounting holes.

Preferably, the first rail has a front part and a rear part. The slide rail assembly further comprises a first bracket and a second bracket arranged on the first rail and respectively located adjacent to the front part and the rear part.

Preferably, one of the first bracket and the second bracket is movably mounted to the first rail and movable relative to the first rail.

Preferably, one of the first bracket and the second bracket comprises a first wall, a second wall and an extension wall connected between the first wall and the second wall. A space is defined by the first wall, the second wall and the extension wall to accommodate the first rail.

Preferably, one of the first bracket and the second bracket is movable relative to the first rail within a limited range defined by a limiting structure. The limiting structure has an elongated hole and at least one connecting member partially penetrating through the elongated hole. The at least one connecting member is configured to connect one of the first bracket and the second bracket to the first rail.

Preferably, each of the first bracket and the second bracket comprises at least one mounting feature. The first rail is configured to be mounted to a first target object and a second target object respectively through the mounting features of the first bracket and the second bracket.

Preferably, one of the first bracket and the second bracket comprises a first wall, a second wall and an extension wall connected between the first wall and the second wall. The slide rail assembly further comprises a reinforcement member arranged on the extension wall.

According to another embodiment of the present invention, a slide rail assembly comprises a first rail, a second rail and a third rail. The first rail has a first passage and a second passage. The second rail is movable relative to the first rail through the first passage. The third rail is movable relative to the first rail through the second passage.

According to another embodiment of the present invention, a slide rail assembly is configured to mount a first carried object and a second carried object to a first post and a second post of a rack. The slide rail assembly comprises a first rail, a second rail and a third rail. The first rail is configured to be mounted to the first post and the second post through a first bracket and a second bracket. The second rail and a third rail are arranged at different positions on a same side of the first rail and movable relative to the first rail. The second rail is configured to mount the first carried object. The third rail is configured to mount the second carried object.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 is a diagram showing the two carried objects being mounted to the rack through the pair of the slide rail assemblies.

DETAILED DESCRIPTION

Figure 1:
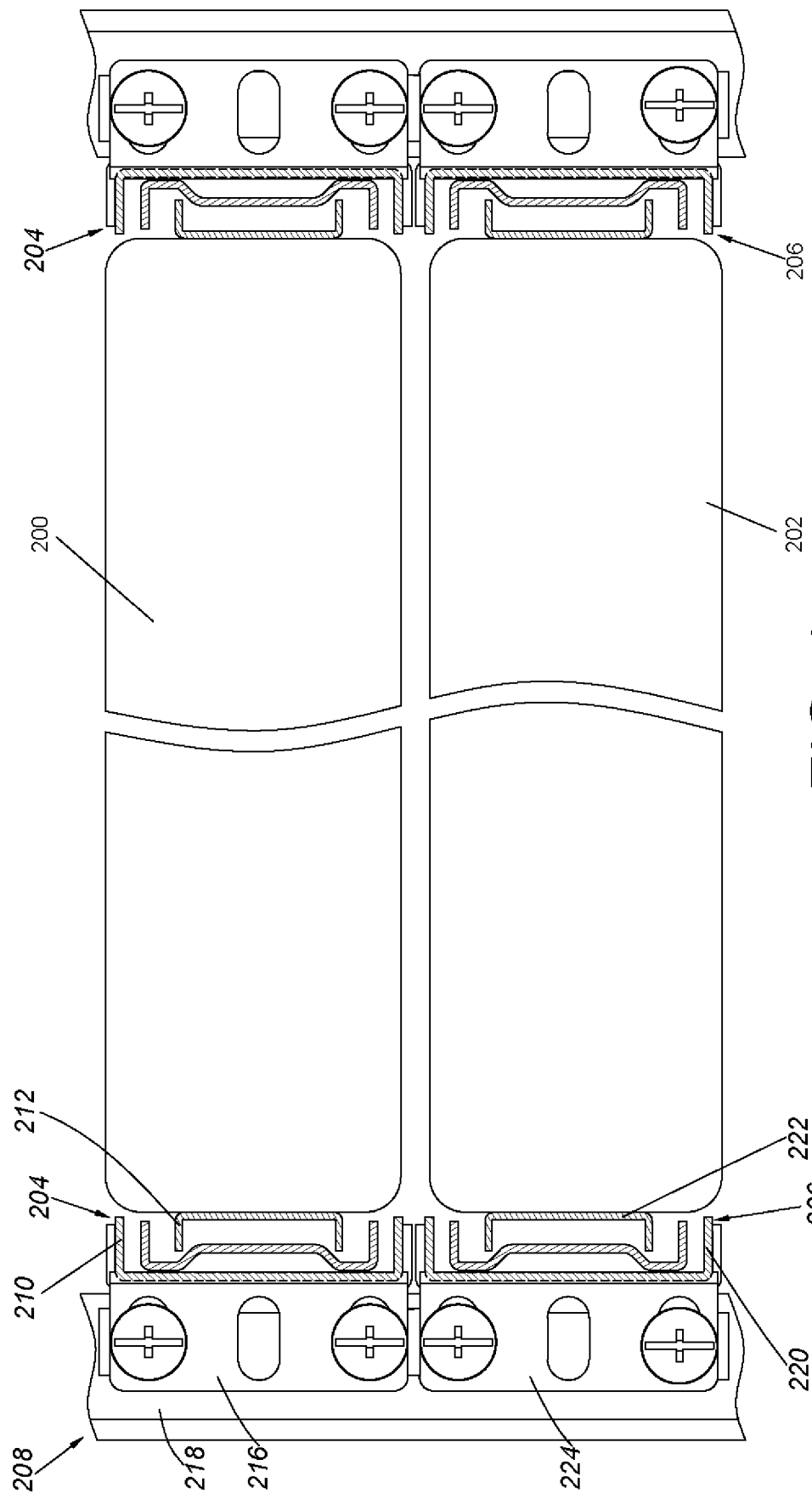
FIG. 1 is a diagram showing two carried objects being mounted to a rack through two pairs of slide rail assemblies of the prior art.
Figure 2:
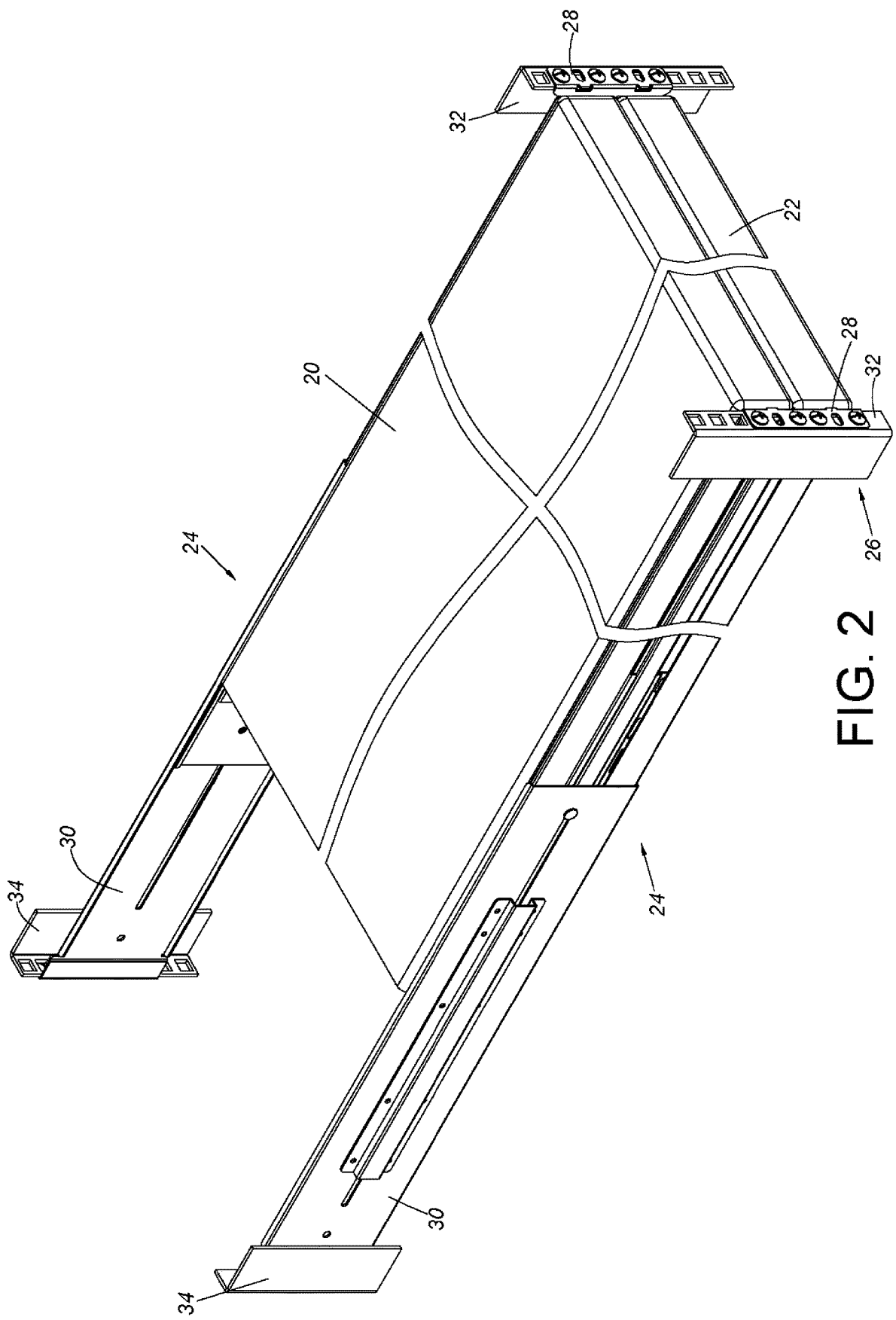
FIG. 2 is a diagram showing a pair of slide rail assemblies capable of mounting two carried objects to a rack according to an embodiment of the present invention, wherein the two carried objects are retracted in the rack.

As shown in FIG. 2, in a rack system, a first carried object 20 and a second carried object 22 are configured to be mounted to a rack 26 through a pair of slide rail assemblies 24. Wherein, each of the first carried object 20 and the second carried object 22 can be an electronic apparatus, a chassis or a drawer. Each of the slide rail assemblies 24 is configured to be mounted to a first post 32 (or a first target object) and a second post 34 (or a second target object) of the rack 26 respectively through a first bracket 28 and a second bracket 30.

Figure 3:
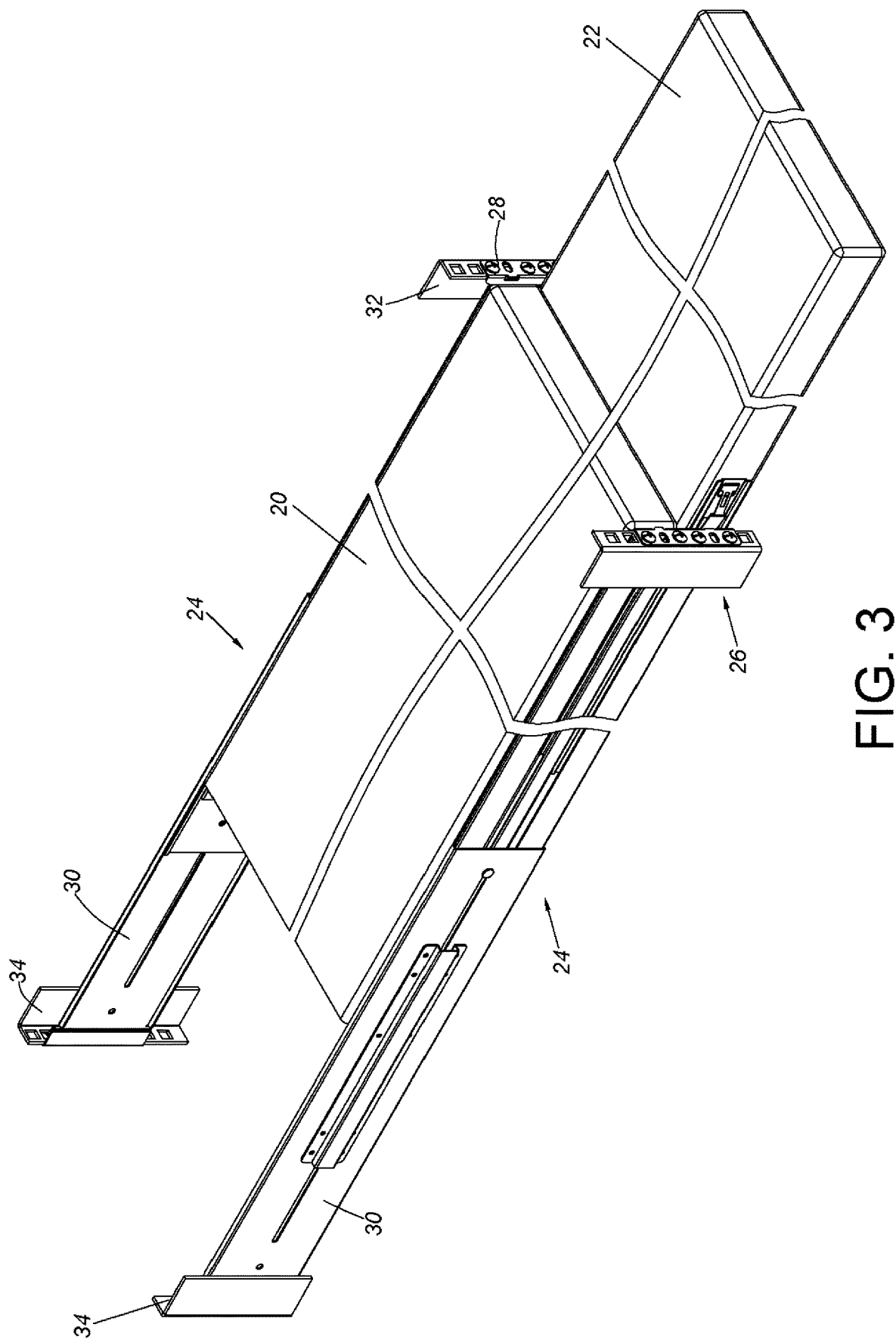
FIG. 3 is a diagram showing the pair of slide rail assemblies capable of mounting the two carried objects to the rack according to an embodiment of the present invention, wherein one of the carried objects is pulled out of the rack.

As shown in FIG. 3, the first carried object 20 and/or the second carried object 22 can be pulled out of or pushed into the rack 26 through the slide rail assemblies 24.

Figure 4:
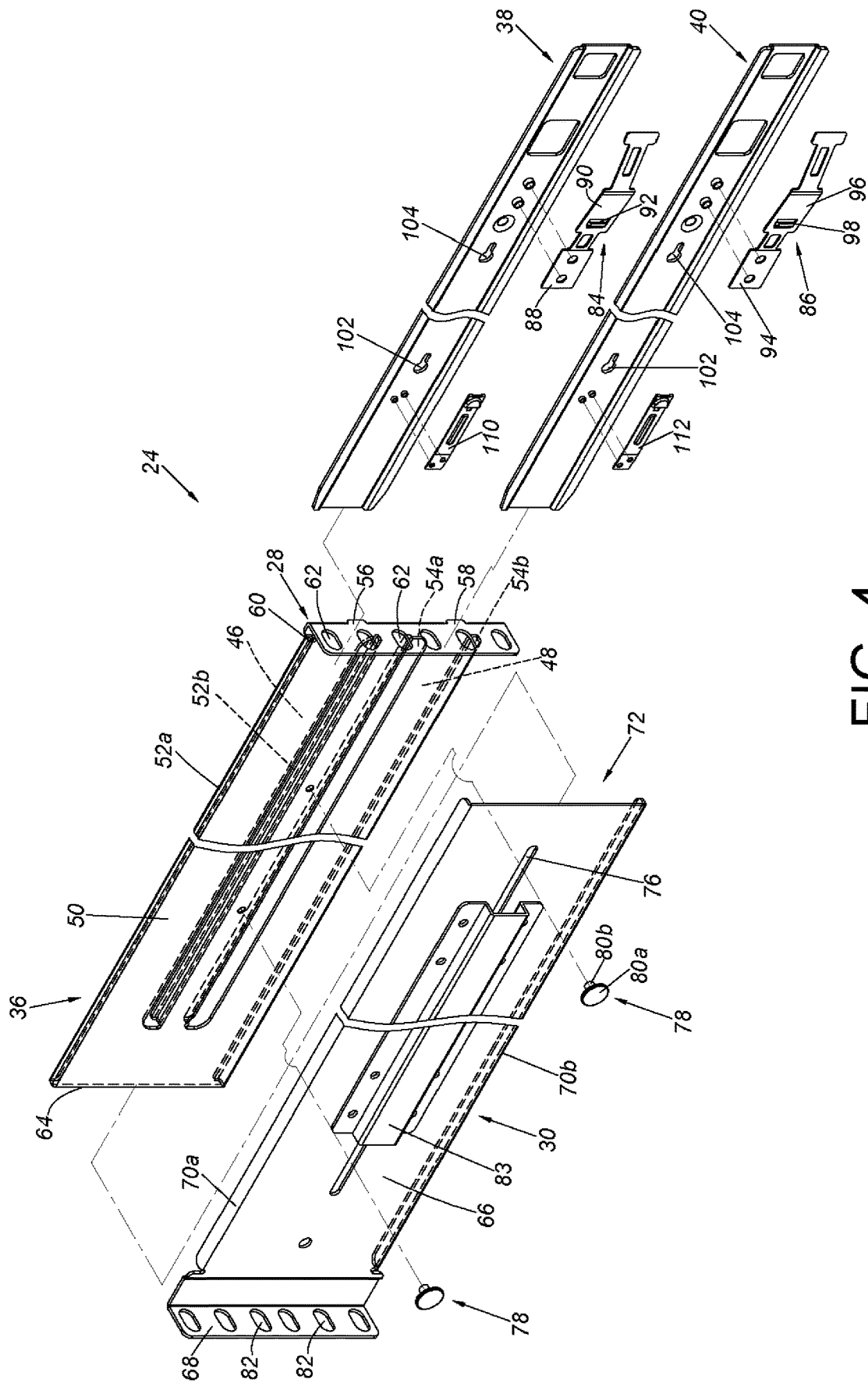
FIG. 4 is an exploded view of the slide rail assembly according to an embodiment of the present invention.
Figure 5:
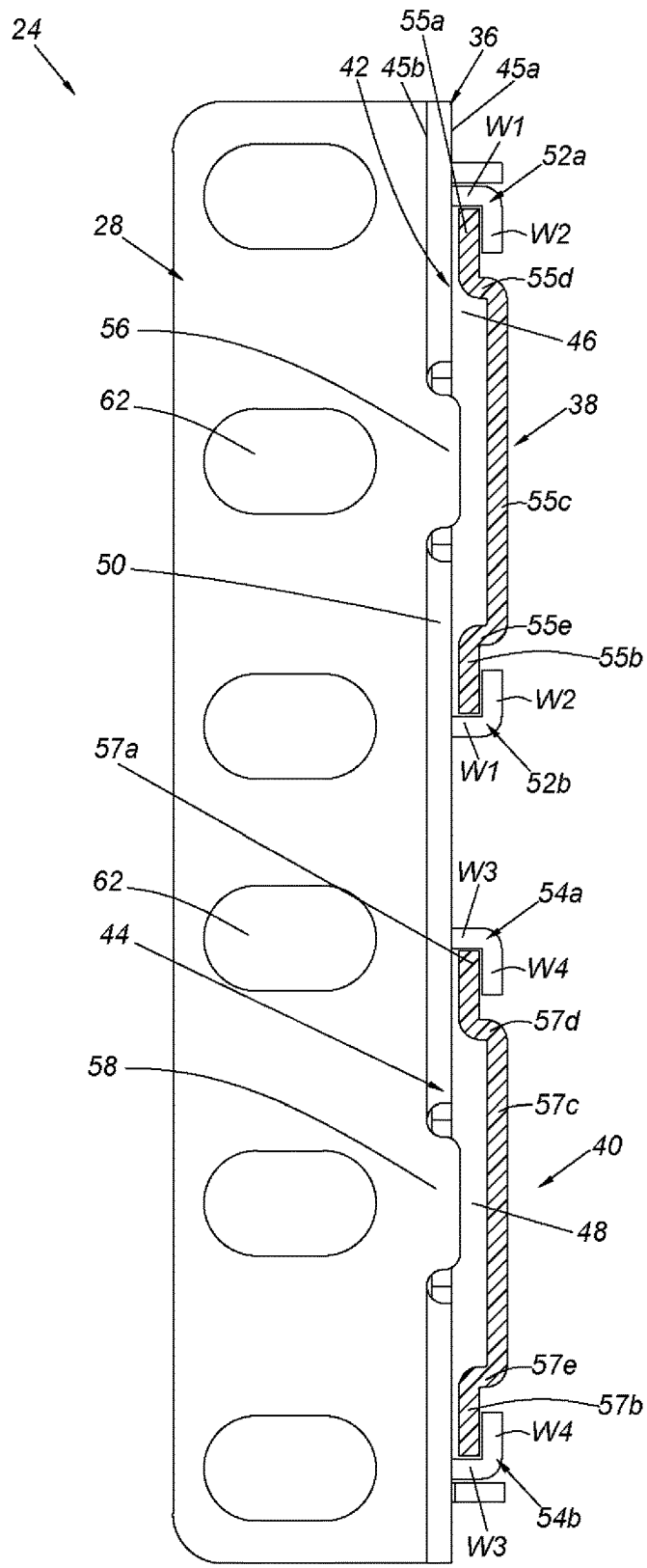
FIG. 5 is a diagram showing a second rail and a third rail configured to be mounted to a first rail of the slide rail assembly according to an embodiment of the present invention.

As shown in FIG. 4 and FIG. 5, the slide rail assembly 24 comprises a first rail 36, a second rail 38 and a third rail 40.

The first rail 36 has a first region 42 and a second region 44. Preferably, the first region 42 and the second region 44 are located at different positions on a same side of the first rail 36. For example, the first rail 36 has a first side 45a and a second side 45b opposite to the first side 45a, and the first region 42 and the second region 44 are located at the first side 45a. Wherein, the first region 42 is arranged with a first passage 46 (or a first longitudinal passage), and the second region 44 is arranged with a second passage 48 (or a second longitudinal passage).

Specifically, the first rail 36 comprises a longitudinal wall 50, a first upper wall 52a, a first lower wall 52b, a second upper wall 54a and a second lower wall 54b. The first upper wall 52a and the first lower wall 52b are connected to the longitudinal wall 50. The first passage 46 is defined by the longitudinal wall 50, the first upper wall 52a and the first lower wall 52b. Preferably, each of the first upper wall 52a and the first lower wall 52b of the first rail 36 comprises a first wall section W1 and a second wall section W2 substantially perpendicularly connected to the first wall section W1. On the other hand, the second upper wall 54a and the second lower wall 54b are connected to the longitudinal wall 50. The second passage 48 is defined by the longitudinal wall 50, the second upper wall 54a and the second lower wall 54b. Preferably, each of the second upper wall 54a and the second lower wall 54b of the first rail 36 comprises a third wall section W3 and a fourth wall section W4 substantially perpendicularly connected to the third wall section W3. Preferably, the first rail 36 further comprises a first blocking feature 56. Preferably, the first rail 36 further comprises a second blocking feature 58. Wherein, the first blocking feature 56 is located adjacent to an end of the first passage 46, and the second blocking feature 58 is located adjacent to an end of the second passage 48. In the present embodiment, each of the first blocking feature 56 and the second blocking feature 58 is a protrusion, but the present invention is not limited thereto.

The second rail 38 is movably mounted on the first region 42 and movable relative to the first rail 36. For example, the second rail 38 is movable relative to the first rail 36 through the first passage 46. Preferably, the second rail 38 comprises an upper rail section 55a, a lower rail section 55b and a middle section 55c connected between the upper rail section 55a and the lower rail section 55b. Preferably, a first bent section 55d is formed between the upper rail section 55a and the middle section 55c, and a second bent section 55e is formed between the lower rail section 55b and the middle section 55c. Wherein, the upper rail section 55a and the lower rail section 55b are located within the first passage 46 of the first rail 36 and configured to respectively abut against the first upper wall 52a and the first lower wall 52b of the first rail 36, in order to improve supporting strength between the second rail 38 and the first rail 36.

The third rail 40 is movably mounted on the second region 44 and movable relative to the first rail 36. For example, the third rail 40 is movable relative to the first rail 36 through the second passage 48. Preferably, the third rail 40 comprises an upper rail section 57a, a lower rail section 57b and a middle section 57c connected between the upper rail section 57a and the lower rail section 57b. Preferably, a first bent section 57d is formed between the upper rail section 57a and the middle section 57c, and a second bent section 57e is formed between the lower rail section 57b and the middle section 57c. Wherein, the upper rail section 57a and the lower rail section 57b are located within the second passage 48 of the first rail 36 and configured to respectively abut against the second upper wall 54a and the second lower wall 54b of the first rail 36, in order to improve supporting strength between the third rail 40 and the first rail 36.

The first bracket 28 is located adjacent to a front part 60 of the first rail 36. The first bracket 28 can be an additional accessory mounted to the longitudinal wall 50 of the first rail 36 and adjacent to the front part 60 of the first rail 36. Or, in the present embodiment, the first bracket 28 can be integrally formed on the longitudinal wall 50 of the first rail 36 and adjacent to the front part 60 of the first rail 36. As such, the first bracket 28 can be seen as a portion of the first rail 36. Moreover, the first bracket 28 has at least one mounting feature 62. In the present embodiment, the first bracket 28 has a plurality of connecting holes as the mounting features 62.

Figures 6, 7:
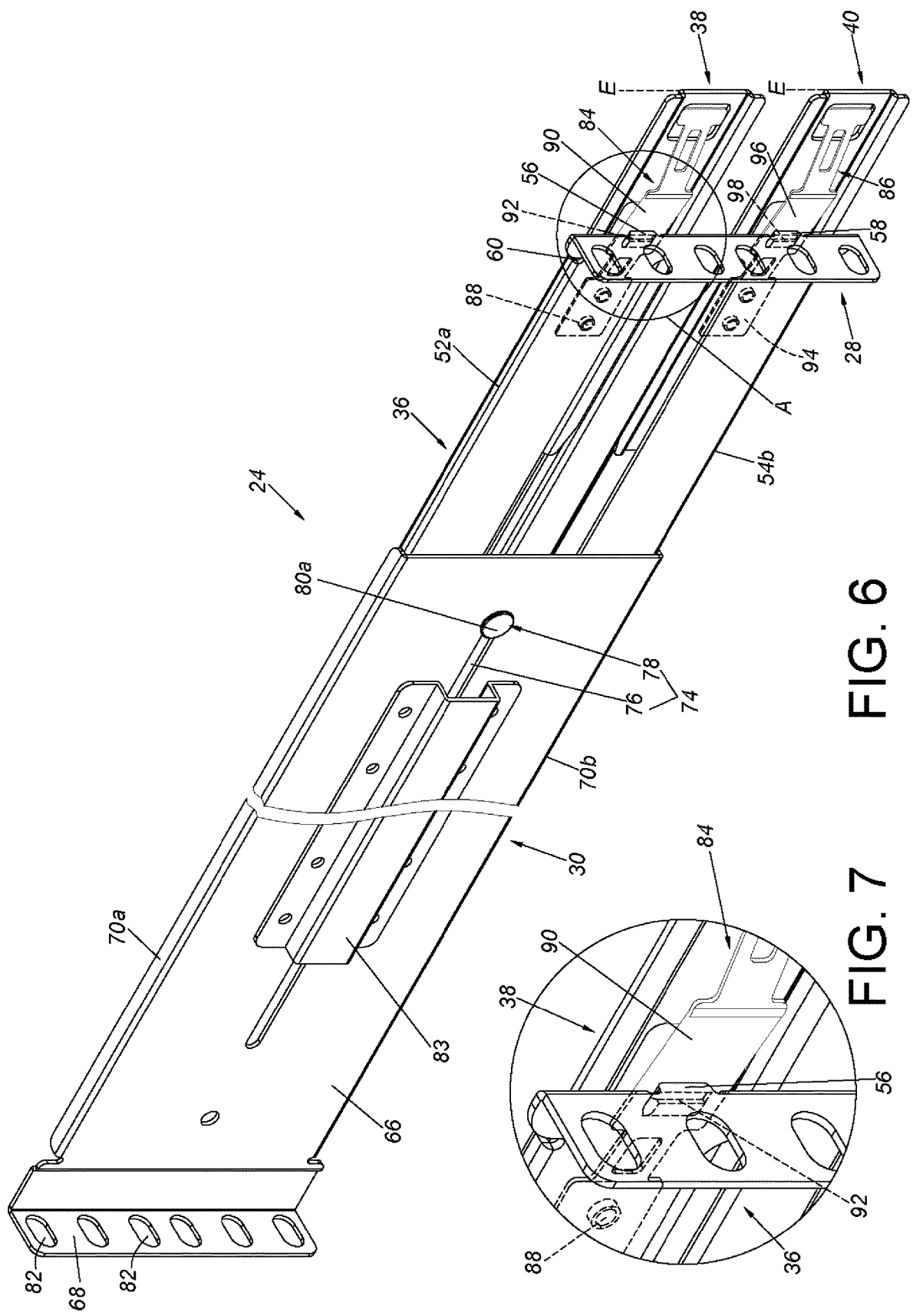
FIG. 6 is a diagram showing the slide rail assembly according to an embodiment of the present invention, wherein the second rail and the third rail are located at an extension position relative to the first rail.
FIG. 7 is an enlarged view of an area A of FIG. 6.

As shown in FIG. 4 and FIG. 6, the second bracket 30 is movably mounted to the first rail 36 and adjacent to a rear part 64 of the first rail 36. In other words, the second bracket 30 and the first bracket 28 can respectively be a rear bracket and a front bracket of the first rail 36. Specifically, the second bracket 30 comprises an extension wall 66 and an end wall 68 substantially perpendicularly connected to the extension wall 66. Preferably, the second bracket 30 further comprises a first wall 70a and a second wall 70b. The extension wall 66 is connected between the first wall 70a and the second wall 70b. Wherein, a space 72 is defined by the first wall 70a, the second wall 70b and the extension wall 66. The first rail 36 is movably mounted within the space 72, such that the second bracket 30 and the first rail 36 (or the first bracket 28) are movable relative to each other.

Preferably, the second bracket 30 is movable relative to the first rail 36 within a limited range defined by a limiting structure 74. For example, the limiting structure 74 comprises an elongated hole 76 and at least one connecting member 78 (such as two connecting members 78). In the present embodiment, the second bracket 30 has the elongated hole 76, and the connecting member 78 comprises a head part 80a and a body part 80b connected to the head part 80a. A dimension of the head part 80a is greater than a dimension of the body part 80b. The head part 80a is located at a side of the second bracket 30. The body part 80b penetrates through a portion of the elongated hole 76, in order to connect the second bracket 30 to the first rail 36, such that the second bracket 30 is movable relative to the first rail 36 within the limited range. The second bracket 30 has at least one mounting feature 82 arranged on the end wall 68. In the present embodiment, the second bracket 30 has a plurality of connecting holes as the mounting features 82. Preferably, a reinforcement member 83 is arranged on the extension wall 66 of the second bracket 30. The reinforcement member 83 is configured to improve structure strength of the second bracket 30. Wherein, the reinforcement member 83 can be connected to the second bracket 30 by riveting, welding or screwing.

Preferably, a length of the second rail 38 and/or the third rail 40 can be smaller than a length of the first rail 36, in order to carry the first carried object 20 and the second carried object 22, such that the second rail 38 and the third rail 40 can be adapted to shorter carried objects. On the other hand, the length of the second rail 38 and/or the third rail 40 can be identical to the length of the first rail 36, such that the second rail 38 and the third rail 40 can be adapted to longer carried objects. The length of the second rail 38 and/or the third rail 40 is not limited in the present embodiment.

Preferably, the slide rail assembly 24 further comprises at least one elastic member. In the present embodiment, the slide rail assembly 24 comprises a first elastic member 84 and a second elastic member 86. The first elastic member 84 and the second elastic member 86 are respectively arranged on the second rail 38 and the third rail 40. The first elastic member 84 comprises a first connecting part 88, a first elastic part 90 connected to the first connecting part 88 and tilted relative to the first connecting part 88, and a first blocking section 92 arranged on the first elastic part 90. Similarly, the second elastic member 86 comprises a second connecting part 94, a second elastic part 96 connected to the second connecting part 94 and tilted relative to the second connecting part 94, and a second blocking section 98 arranged on the second elastic part 96. Wherein, the first blocking section 92 and/or the second blocking section 98 can be a protruded structure, or the first blocking section 92 and/or the second blocking section 98 can be a recessed structure or a hole.

As shown in FIG. 6, when the second rail 38 (or the third rail 40) is moved from a retracted position to an extension position E relative to the first rail 36, the second rail 38 is configured to be engaged with or blocked by the first blocking feature 56 of the first rail 36 through the first elastic member 84 (or the third rail 40 is configured to be engaged with or blocked by the second blocking feature 58 of the first rail 36 through the second elastic member 86), such that the second rail 38 and/or the third rail 40 can be temporarily held at the extension position E relative to the first rail 36. As shown in FIG. 7, when the second rail 38 is located at the extension position E, the second rail 38 is configured to be engaged with or blocked by the first blocking feature 56 of the first rail 36 through the first blocking section 92 on the first elastic member 84. On the other hand, when a force is applied to the first elastic part 90 (or the second elastic part 96), the first blocking section 92 can be detached from the first blocking feature 56 (or the second blocking section 98 can be detached from the second blocking feature 58), such that the second rail 38 (or the third rail 40) can be operated to move from the extension position E relative to the first rail 36 (such as being removed from the first rail 36).

Figure 8:
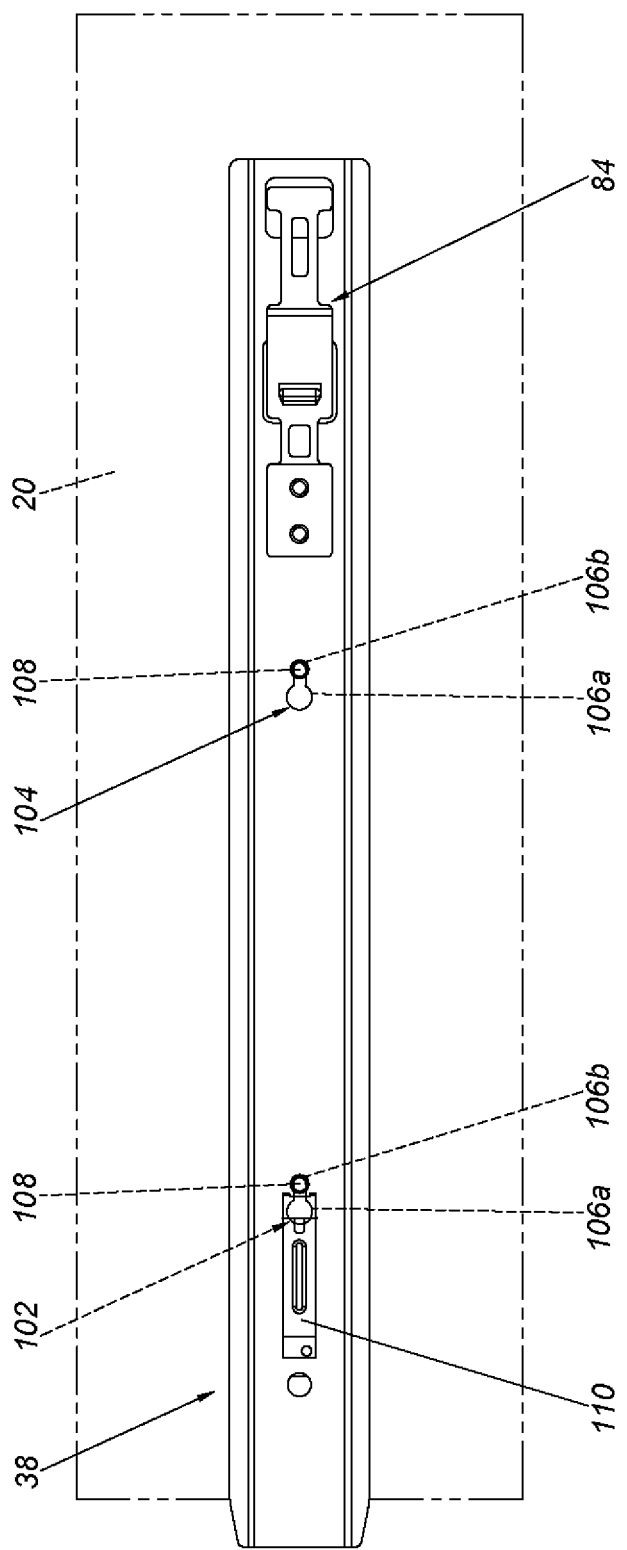
FIG. 8 is a diagram showing a first carried object being mounted to the second rail of the slide rail assembly according to an embodiment of the present invention.

As shown in FIG. 4 and FIG. 8, each of the second rail 38 and the third rail 40 comprises a plurality of mounting holes spaced from each other (such as a first mounting hole 102 and a second mounting hole 104). In the present embodiment, each of the mounting holes 102, 104 comprises a first hole part 106a and a second hole part 106b communicated with the first hole part 106a, and the first hole part 106a is greater than the second hole part 106b. Wherein, a plurality of mounting members 108 (such as standoffs) of the first carried object 20 can be mounted to the mounting holes 102, 104 of the second rail 38. Preferably, the slide rail assembly 24 further comprises a first elastic blocking member 110 configured to block the first hole part 106a of one of the mounting holes 102, 104 of the second rail 38. Preferably, the slide rail assembly 24 can further comprises a second elastic blocking member 112 configured to block the first hole part 106a of one of the mounting holes 102, 104 of the third rail 40. For example, the mounting member 108 of the first carried object 20 is configured to push the first elastic blocking member 110 through the first hole part 106a of the first mounting hole 102 of the second rail 38, in order to tilt the first elastic blocking member 110 relative to the second rail 38 to be away from the first hole part 106a of the first mounting hole 102 of the second rail 38. After the mounting member 108 of the first carried object 20 is moved into the second hole part 106b via the first hole part 106a, the first elastic blocking member 110 returns to an initial state. Thereafter, the first hole part 106a of the first mounting hole 102 of the second rail 38 is blocked by the first elastic blocking member 110, in order to prevent the first carried object 20 from moving relative to the second rail 38. Similarly, a plurality of mounting members of the second carried object 22 can be mounted to the mounting holes 102, 104 of the third rail 40. For simplification, please refer to the related arrangement of the second rail 38 and the first carried object 20 (as shown in FIG. 8), no further illustration is provided.

As shown in FIG. 9, the first carried object 20 and the second carried object 22 can be mounted to the posts of the rack 26 through the slide rail assemblies 24. For example, the first bracket 28 can be mounted to the first post 32 of the rack 26 by at least one fastening member 114 through the at least one mounting feature 62 of the first bracket 28. Since the first passage 46 and the second passage 48 are formed at the same side of the first rail 36, the second rail 38 and the third rail 40 can be mounted to the first passage 46 and the second passage 48 respectively to reduce a distance between the second rail 38 and the third rail 40. According to the above arrangement, when both the first carried object 20 and the second carried object 22 are respectively mounted to the second rail 38 and the third rail 40, the first carried object 20 can be closer to the second carried object 22 for saving space.

Therefore, the slide rail assembly of the present invention is characterized in that:

1. Two slide rails (such as the second rail and the third rail) can be mounted to different positions on a same side of the first rail, such that manufacturing cost of the slide rail assembly can be reduced.

2. The second rail and/or the third rail can be temporarily held at the extension position relative to the first rail, such that maintenance of the slide rail assembly and the carried object can be easily and conveniently performed.

3. Supporting structures are formed between the first rail and the second rail, and between the first rail and the third rail to abut against each other, in order to improve supporting strength therebetween.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail having a first region and a second region located at different positions on a same side of the first rail, a longitudinal wall, a first upper wall, a first lower wall, a second upper wall and a second lower wall, the first region and the second region being respectively arranged with a first passage and a second passage, the first passage being defined by the longitudinal wall, the first upper wall and the first lower wall of the first rail, the second passage being defined by the longitudinal wall, the second upper wall and the second lower wall;
a second rail arranged on the first region and movable relative to the first rail through the first passage; and
a third rail arranged on the second region and movable relative to the first rail through the second passage;
wherein each of the first upper wall and the first lower wall of the first rail comprises a first wall section and a second wall section substantially perpendicularly connected to the first wall section, the second wall section of the first upper wall protrudes from the first wall section of the first upper wall and extends toward the first lower wall, the second wall section of the first lower wall protrudes from the first wall section of the first lower wall and extends toward the first upper wall;
wherein the second rail comprises an upper rail section, a lower rail section and a middle section connected between the upper rail section and the lower rail section of the second rail;
wherein the upper rail section and the lower rail section of the second rail extend away from each other, are located within the first passage of the first rail, and are configured to respectively abut against the first upper wall and the first lower wall of the first rail.

2. The slide rail assembly of claim 1, wherein the second rail and the third rail are movable relative to the first rail along a longitudinal direction of the first rail.

3. The slide rail assembly of claim 1, wherein each of the second upper wall and the second lower wall of the first rail comprises a third wall section and a fourth wall section substantially perpendicularly connected to the third wall section, the third rail comprises an upper rail section, a lower rail section and a middle section connected between the upper rail section and the lower rail section of the third rail, the upper rail section and the lower rail section of the third rail are located within the second passage of the first rail and configured to respectively abut against the second upper wall and the second lower wall of the first rail.

4. The slide rail assembly of claim 1, wherein the first rail further comprises a blocking feature located adjacent to an end of the first passage.

5. The slide rail assembly of claim 4, further comprising an elastic member arranged at the second rail, wherein when the second rail is located at an extension position relative to the first rail, the blocking feature is configured to block the second rail through the elastic member.

6. The slide rail assembly of claim 1, wherein at least one of the second rail and the third rail has a plurality of mounting holes, each of the mounting holes has a first hole part and a second hole part communicated with the first hole part, the first hole part is greater than the second hole part.

7. The slide rail assembly of claim 6, further comprising a blocking member configured to block the first hole part of one of the mounting holes.

8. The slide rail assembly of claim 1, wherein the first rail has a front part and a rear part, the slide rail assembly further comprises a first bracket and a second bracket arranged on the first rail and respectively located adjacent to the front part and the rear part.

9. The slide rail assembly of claim 8, wherein one of the first bracket and the second bracket is movably mounted to the first rail and movable relative to the first rail.

10. The slide rail assembly of claim 9, wherein one of the first bracket and the second bracket comprises a first wall, a second wall and an extension wall connected between the first wall and the second wall, a space is defined by the first wall, the second wall and the extension wall, the first rail is movably mounted within the space.

11. The slide rail assembly of claim 9, wherein one of the first bracket and the second bracket is movable relative to the first rail within a limited range defined by a limiting structure, the limiting structure has an elongated hole and at least one connecting member partially penetrating through the elongated hole, the at least one connecting member is configured to connect one of the first bracket and the second bracket to the first rail.

12. The slide rail assembly of claim 9, wherein each of the first bracket and the second bracket comprises at least one mounting feature, the first rail is configured to be mounted to a first target object and a second target object respectively through the mounting features of the first bracket and the second bracket.

13. The slide rail assembly of claim 9, wherein one of the first bracket and the second bracket comprises a first wall, a second wall and an extension wall connected between the first wall and the second wall, the slide rail assembly further comprises a reinforcement member arranged on the extension wall.

14. A slide rail assembly, comprising:
  a first rail having a first passage a second passage, a longitudinal wall, a first upper wall, a first lower wall, a second upper wall and a second lower wall, the first passage being defined by the longitudinal wall, the first upper wall and the first lower wall of the first rail, the second passage being defined by the longitudinal wall, the second upper wall and the second lower wall;
  a second rail movable relative to the first rail through the first passage; and
  a third rail movable relative to the first rail through the second passage;
  wherein each of the first upper wall and the first lower wall of the first rail comprises a first wall section and a second wall section substantially perpendicularly connected to the first wall section, the second wall section of the first upper wall protrudes from the first wall section of the first upper wall and extends toward the first lower wall, the second wall section of the first lower wall protrudes from the first wall section of the first lower wall and extends toward the first upper wall;
  wherein the second rail comprises an upper rail section, a lower rail section and a middle section connected between the upper rail section and the lower rail section of the second rail;
  wherein the upper rail section and the lower rail section of the second rail extend away from each other, are located within the first passage of the first rail, and are configured to respectively abut against the first upper wall and the first lower wall of the first rail.

15. The slide rail assembly of claim 14, wherein the first passage and the second passage are located at a same side of the first rail.

16. The slide rail assembly of claim 15, wherein the first upper wall, the first lower wall, the second upper wall and the second lower wall are connected to the longitudinal wall; the first rail further comprises a first blocking feature and a second blocking feature respectively located adjacent to ends of the first passage and the second passage.

17. A slide rail assembly, configured to mount a first carried object and a second carried object to a first post and a second post of a rack, the slide rail assembly comprising:
  a first rail having a longitudinal wall, a first upper wall, a first lower wall, a second upper wall and a second lower wall, the first rail being configured to be mounted to the first post and the second post through a first bracket and a second bracket; and
  a second rail and a third rail arranged at different positions on a same side of the first rail and movable relative to the first rail, wherein the second rail is configured to mount the first carried object, the third rail is configured to mount the second carried object;
  wherein each of the first upper wall and the first lower wall of the first rail comprises a first wall section and a second wall section substantially perpendicularly connected to the first wall section, the second wall section of the first upper wall protrudes from the first wall section of the first upper wall and extends toward the first lower wall, the second wall section of the first lower wall protrudes from the first wall section of the first lower wall and extends toward the first upper wall;
  wherein the second rail comprises an upper rail section, a lower rail section and a middle section connected between the upper rail section and the lower rail section of the second rail;
  wherein the upper rail section and the lower rail section of the second rail extend away from each other, and are configured to respectively abut against the first upper wall and the first lower wall of the first rail.

18. The slide rail assembly of claim 17, wherein the second rail and the third rail are respectively mounted within a first passage and a second passage on a same side of the first rail, the second rail and the third rail are movable relative to the first rail respectively through the first passage and the second passage.

* * * * *